US012622324B2

(12) United States Patent
Sander et al.

(10) Patent No.: US 12,622,324 B2
(45) Date of Patent: May 5, 2026

(54) SEMICONDUCTOR PACKAGE AND METHOD FOR PRODUCING A SEMICONDUCTOR PACKAGE

(71) Applicant: Infineon Technologies AG, Neubiberg (DE)

(72) Inventors: Rainald Sander, Oberhaching (DE); Lars Eckert, Neubiberg (DE); Fortunato Lopez, Unterhaching (DE)

(73) Assignee: Infineon Technologies AG, Neubiberg (DE)

( * ) Notice: Subject to any disclaimer, the term of this patent is extended or adjusted under 35 U.S.C. 154(b) by 790 days.

(21) Appl. No.: 18/045,393

(22) Filed: Oct. 10, 2022

(65) Prior Publication Data

US 2023/0131909 A1    Apr. 27, 2023

(30) Foreign Application Priority Data

Oct. 21, 2021    (DE) .......................... 102021127308.0

(51) Int. Cl.
| | |
|---|---|
| *H01L 25/16* | (2023.01) |
| *H01L 23/00* | (2006.01) |
| *H01L 23/495* | (2006.01) |

(52) U.S. Cl.
CPC ...... *H01L 25/165* (2013.01); *H01L 23/49575* (2013.01); *H01L 24/48* (2013.01);
(Continued)

(58) Field of Classification Search
None
See application file for complete search history.

(56) References Cited

U.S. PATENT DOCUMENTS

| | | | |
|---|---|---|---|
| 5,444,291 A | 8/1995 | Paparo et al. | |
| 2007/0252265 A1* | 11/2007 | Sander ................... | H01L 24/37 |
| | | | 257/691 |

(Continued)

FOREIGN PATENT DOCUMENTS

DE        69126618 T2      1/1998

OTHER PUBLICATIONS

Office Action, from counterpart German Application No. 102021127308.0 dated May 25, 2022, 6 pp.

*Primary Examiner* — Sue A Purvis
*Assistant Examiner* — Jordan M Klein
(74) *Attorney, Agent, or Firm* — Shumaker & Sieffert, P.A.

(57)        ABSTRACT

A semiconductor package comprises an encapsulation having a first lateral side and an opposite second lateral side, at least one power semiconductor chip having a drain contact region running along the first lateral side, a source contact region running along the second lateral side, and first and second inner contact regions arranged between the drain and source contact regions, a first external terminal which is connected to the drain contact region, is arranged centrally on the first lateral side, and is configured to apply a supply voltage for the at least one power semiconductor chip, a second external terminal which is connected to the source contact region, is arranged centrally on the second lateral side, and is configured to apply a reference voltage for the at least one power semiconductor chip, third and fourth external terminals which are connected to the first inner contact region. are arranged opposite each other at a first end of the first and second lateral sides, respectively, and are configured a first output of the semiconductor package, and fifth and sixth external terminals which are connected to the second inner contact region and are arranged opposite each other at a second end of the first and second lateral sides, (Continued)

respectively, and are configured as a second output of the semiconductor package.

15 Claims, 6 Drawing Sheets

(52) U.S. Cl.
CPC ............... *H01L 2224/48245* (2013.01); *H01L 2924/13091* (2013.01); *H01L 2924/1426* (2013.01); *H01L 2924/1815* (2013.01); *H01L 2924/182* (2013.01); *H01L 2924/30101* (2013.01); *H01L 2924/30107* (2013.01)

(56) References Cited

U.S. PATENT DOCUMENTS

2008/0252372 A1* 10/2008 Williams ............... H10D 84/85
330/251
2019/0088577 A1* 3/2019 Shimoyama ........... H05K 7/209

* cited by examiner

500

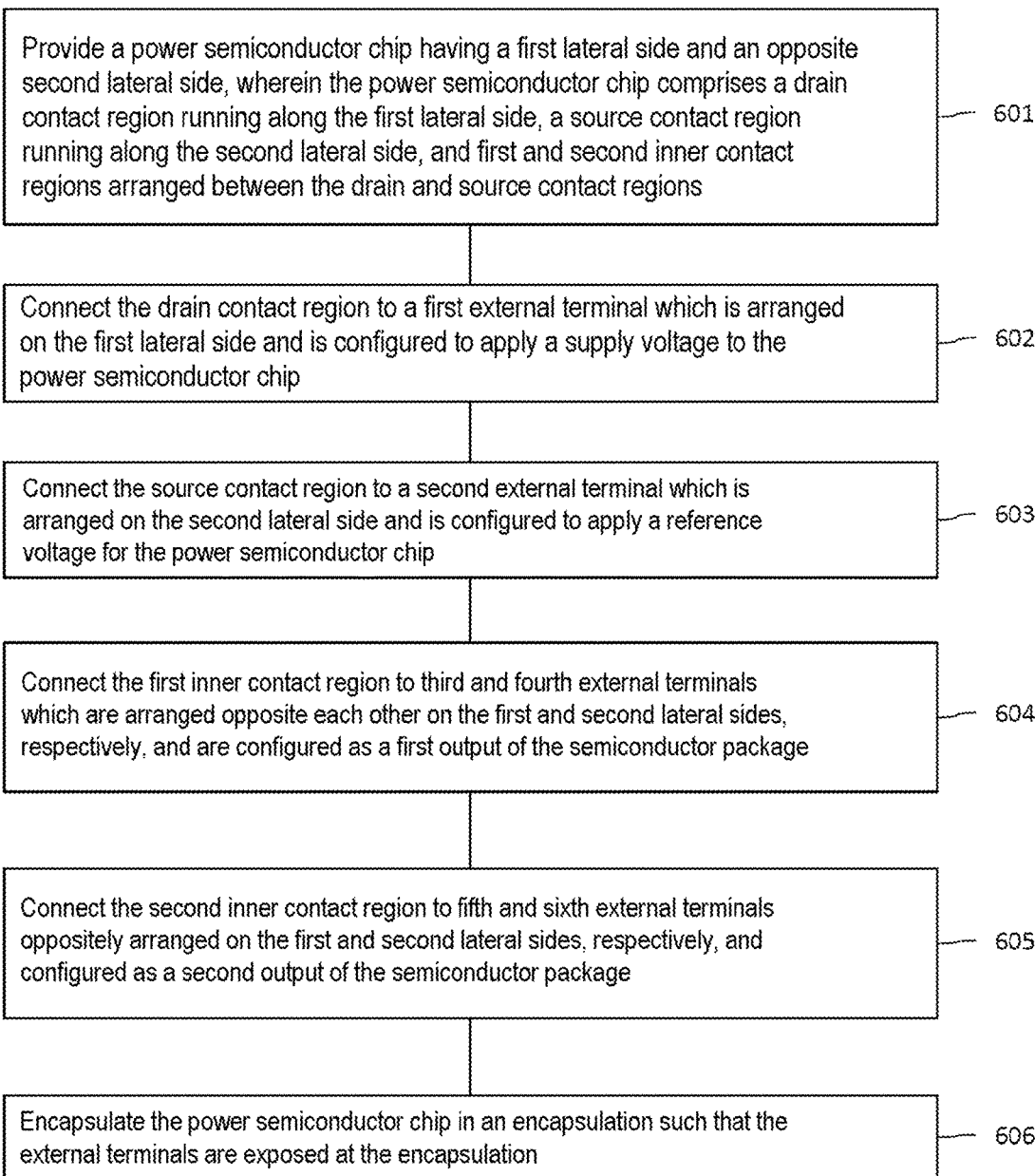

600

Provide a power semiconductor chip having a first lateral side and an opposite second lateral side, wherein the power semiconductor chip comprises a drain contact region running along the first lateral side, a source contact region running along the second lateral side, and first and second inner contact regions arranged between the drain and source contact regions — 601

Connect the drain contact region to a first external terminal which is arranged on the first lateral side and is configured to apply a supply voltage to the power semiconductor chip — 602

Connect the source contact region to a second external terminal which is arranged on the second lateral side and is configured to apply a reference voltage for the power semiconductor chip — 603

Connect the first inner contact region to third and fourth external terminals which are arranged opposite each other on the first and second lateral sides, respectively, and are configured as a first output of the semiconductor package — 604

Connect the second inner contact region to fifth and sixth external terminals oppositely arranged on the first and second lateral sides, respectively, and configured as a second output of the semiconductor package — 605

Encapsulate the power semiconductor chip in an encapsulation such that the external terminals are exposed at the encapsulation — 606

Fig. 6

SEMICONDUCTOR PACKAGE AND METHOD FOR PRODUCING A SEMICONDUCTOR PACKAGE

TECHNICAL FIELD

The present disclosure relates to a semiconductor package and to a method for producing a semiconductor package.

BACKGROUND

Semiconductor packages can comprise at least one power semiconductor chip having a plurality of contacts or contact regions, for example, drain and source contact regions, and external terminals connected to the contact regions. The relative arrangement of the contact regions on the power semiconductor chip and the external terminals in relation to each other may affect, for example, the length of the electrical connections between the various contact regions and external terminals. This, in turn, may help determine what parasitic resistances and/or parasitic inductances are caused by the electrical connections in the semiconductor package, with longer electrical connections having greater parasitic effects. However, for many applications for which semiconductor packages may be intended, such as drivers for electric motors, such parasitic effects can be problematic, and thus there is a desire to reduce such parasitic effects. Improved semiconductor packages and improved methods for producing semiconductor package can help solve this and other problems.

The problem forming the basis of the invention is solved by the features of the independent claims. Advantageous embodiments and developments of the invention are described in the dependent claims.

OVERVIEW

Individual examples relate to a semiconductor package comprising: an encapsulation having a first lateral side and an opposite second lateral side, at least one power semiconductor chip having a drain contact region running along the first lateral side, a source contact region running along the second lateral side, and first and second inner contact regions arranged between the drain and source contact regions, a first external terminal which is connected to the drain contact region, is arranged centrally on the first lateral side, and is configured to apply a supply voltage for the at least one power semiconductor chip, a second external terminal which is connected to the source contact region, is arranged centrally on the second lateral side, and is configured to apply a reference voltage for the at least one power semiconductor chip, third and fourth external terminals which are connected to the first inner contact region, are arranged opposite each other at a first end of the first and second lateral sides, respectively, and are configured as a first output of the semiconductor package, and fifth and sixth external terminals which are connected to the second inner contact region, are arranged opposite each other at a second end of the first and second lateral sides, respectively, and are configured as a second output of the semiconductor package.

Individual examples relate to a semiconductor package comprising: an encapsulation having a first lateral side, a second lateral side opposite the first lateral side, a third lateral side, and a fourth lateral side opposite the third lateral side, a power semiconductor chip having a drain contact side, a source contact region running along the first lateral side, a source contact region running along the second lateral side, and first and second inner contact regions arranged between the drain and source contact regions, a first external terminal which is connected to the drain contact region, is arranged centrally on the first lateral side, and is configured to apply a supply voltage to the power semiconductor chip, and a second external terminal which is connected to the source contact region, is arranged centrally on the second lateral side, and is configured to apply a reference voltage for the power semiconductor chip, a third external terminal which is connected to the first inner contact region, is arranged centrally on the third lateral side, and is configured to be a first output of the semiconductor package, and a fifth external terminal which is connected to the second inner contact region, is arranged centrally on the fourth lateral side, and is configured to be a second output of the semiconductor package.

Individual examples relate to a method for producing a semiconductor package, wherein the method comprises: providing a power semiconductor chip having a first lateral side and an opposite second lateral side, wherein the power semiconductor chip comprises a drain contact region running along the first lateral side, a source contact region running along the second lateral side, and first and second inner contact regions arranged between the drain and source contact regions, connecting the drain contact region to a first external terminal which is arranged on the first lateral side and is configured to apply a supply voltage for the power semiconductor chip, connecting the source contact region to a second external terminal which is arranged on the second lateral side and is configured to apply a reference voltage for the power semiconductor chip, connecting the first inner contact region to third and fourth external terminals which are arranged opposite each other on the first and second lateral sides, respectively, and are configured as the first output of the semiconductor package, connecting the second inner contact region to fifth and sixth external terminals which are arranged opposite each other on the first and second lateral sides, respectively, and are configured as a second output of the semiconductor package, and encapsulating the power semiconductor chip in an encapsulation such that the external terminals are exposed at the encapsulation.

BRIEF DESCRIPTION OF THE DRAWINGS

The accompanying drawings represent examples and, together with the description, serve to explain the main features of the disclosure. The elements of the drawings are not necessarily shown to scale with respect to each other. Identical reference signs may designate corresponding, similar, or identical parts.

FIG. 6 is a flowchart of an exemplary method for producing a semiconductor package.

DETAILED DESCRIPTION

In the following detailed description, a particular feature or aspect of an example may be disclosed with respect to only one of a plurality of implementations. Nevertheless, such feature or aspect may be further combined with one or more other features or aspects of the other implementations as may be desirable and advantageous for any given or particular application, unless otherwise specifically indicated or subject to a technical limitation. Where the terms "containing", "having", "with" or other variations thereof, are used, either in the detailed description or in the claims, such terms are further intended to have an inclusive meaning in a manner similar to the term "comprising." The terms "coupled" and "connected" may be used along with derivatives thereof. It should be obvious that these terms may be used to indicate that two elements are cooperating or interacting with each other, whether or not they are in direct physical or electrical contact with each other, and intermediate elements or layers may be provided between the "coupled," "attached," or "connected" elements. Further, the term "by way of example" is intended to mean an example and not the best or optimum.

An efficient method for producing semiconductor packages as well as efficient semiconductor packages can, for example, reduce material consumption, chemical waste or ohmic losses and thus enable savings in energy and/or resources. Improved semiconductor packages as well as improved semiconductor package production methods as specified in this description can thus at least indirectly contribute to green technology solutions, i.e., climate-friendly solutions that enable a reduction of energy and/or resource consumption.

Figure 1:
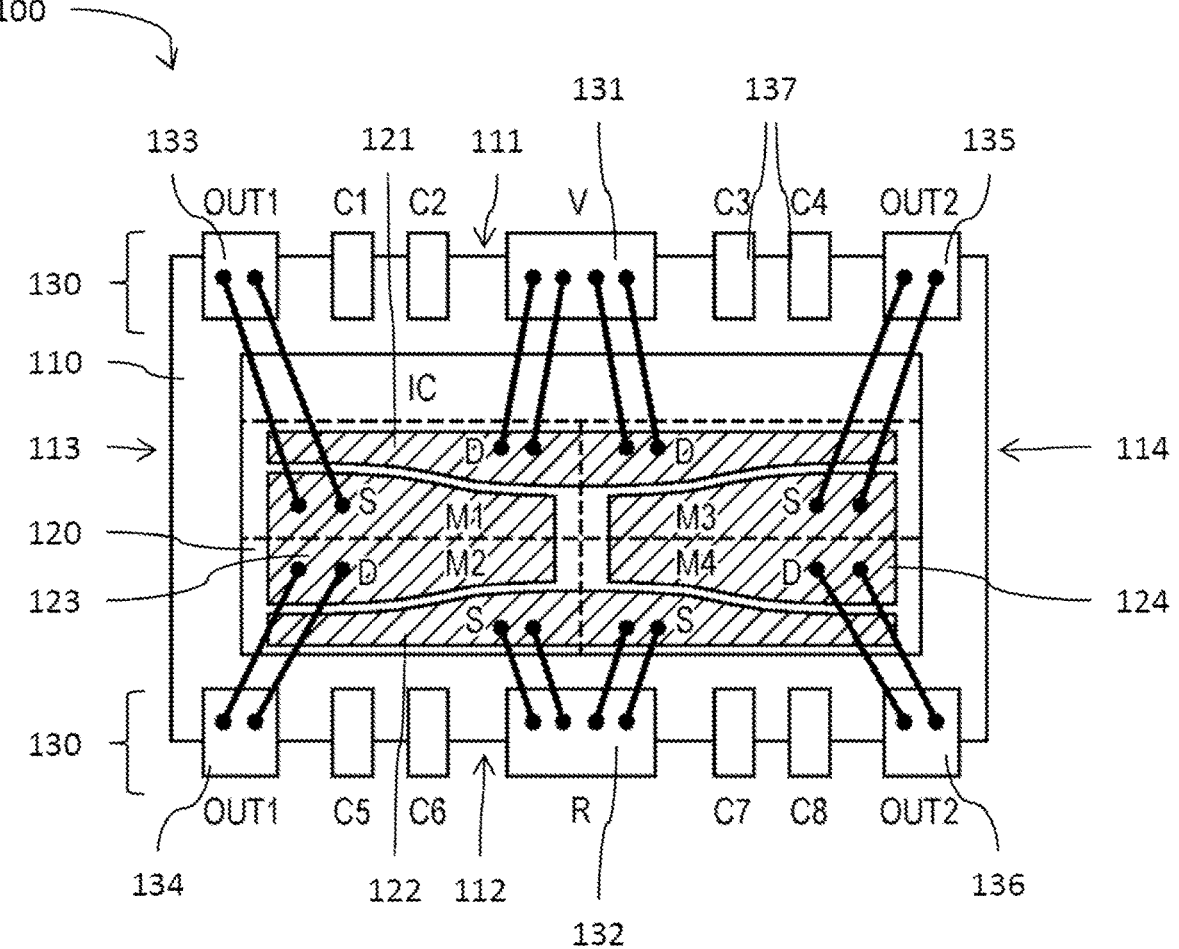
FIG. 1 shows a semiconductor package with a power semiconductor chip and external terminals, wherein external power terminals are located centrally and at the ends of opposite lateral sides of the semiconductor package.

FIG. 1 shows a plan view of a semiconductor package 100 having an encapsulation 110, at least one power semiconductor chip 120, and external terminals 130. The encapsulation 110 is shown transparent in FIG. 1 to show the interior of the semiconductor package 100. According to an example, the semiconductor package 100 comprises exactly one semiconductor chip, namely the power semiconductor chip 120.

For example, the semiconductor package 100 can be a surface mounted device. According to another example, the semiconductor package 100 is a through hole device.

The semiconductor package 100 can, for example, provide a voltage converter. The semiconductor package 100 can comprise an H-bridge circuit, which can be implemented in particular in the at least one power semiconductor chip 120. The semiconductor package 100 can provide, for example, a driver for an electric motor.

The encapsulation 110 comprises a first lateral side 111 and a second lateral side 112 opposite the first lateral side 111. For example, the encapsulation 110 can have a rectangular outline of which the first and second lateral sides 111, 112 are the longer sides of the rectangle. According to another example, the encapsulation 110 can also have a square outline.

The encapsulation 110 can further comprise a third lateral side 113 and an opposite fourth lateral side 114. The third and fourth lateral sides 113, 114 can be, for example, the shorter sides of an encapsulation 110 having a rectangular outline. According to one example, no external terminals 130 are arranged along the third and/or fourth lateral sides 113, 114.

For example, the encapsulation 110 can comprise or consist of a molded body. The encapsulation 110 can comprise or consist of a suitable polymer material. According to one example, a polymer material and filler particles can be contained in the encapsulation 110, wherein the filler particles can serve to improve the thermal conductivity of the encapsulation 110. The encapsulation 110 can completely cover the at least one power semiconductor chip 120.

The power semiconductor chip 120 comprises a drain contact region 121 running along the first lateral side 111, a source contact region 122 running along the second lateral side 112, and first and second inner contact regions 123, 124 arranged between the drain and source contact regions 121, 122.

The contact regions 121-124 can be metallization regions, i.e., separate regions of a metallization of the power semiconductor chip 120. The contact regions 121-124 can comprise or consist of any suitable metal or metal alloy. For example, the contact regions 121-124 can comprise or consist of Al and/or Cu. In particular, the contact regions 121-124 can comprise a solderable metal or a solderable metal alloy.

According to one example, the drain and/or source contact region 121, 122 can taper towards the third and fourth lateral sides 113, 114. In other words, the drain and/or source contact region 121, 122 can have a widening in the middle (cf. FIG. 1). Further, the first and/or second inner contact regions 123, 124 can widen towards the third and fourth lateral sides 113, 114. In other words, the inner contact regions 123, 124 have a widening at the locations of the power semiconductor chip 120 where the source and drain contact regions 121, 122 have a taper. The location where the contact region 121-124 in question has a widening can be provided as an attachment point for electrical terminals, such as bonding wires or clips, to the relevant one of the external terminals 130 (cf. FIG. 1).

As shown in the example of FIG. 1, the contact regions 121-124 can all be arranged on the same main side of the power semiconductor chip 120. According to an example, the semiconductor package 100 comprises a chip carrier (not shown in FIG. 1), wherein the power semiconductor chip 120 is arranged on the chip carrier such that a lower main side of the power semiconductor chip 120 faces the chip carrier. The contact regions 121-124 can be arranged on the upper main side of the power semiconductor chip 120 facing away from the chip carrier. This can mean that the power semiconductor chip 120 is configured for lateral current flow.

The chip carrier can be exposed at the encapsulation 110 so that a heat sink can be connected to the chip carrier. According to one example, the chip carrier can be part of a leadframe. The external connections 130 can also be part of a leadframe, for example the same leadframe as the chip carrier, or can be part of a different leadframe.

The external terminals 130 of the semiconductor package 100 comprise a first external terminal 131 connected to the drain contact region 121. The first external terminal 131 is arranged centrally on the first lateral side 111 of the encapsulation 110. For example, the first external connector 131 can be equally spaced or approximately equally spaced from both ends of the first lateral side 111. The first external terminal 131 is configured to apply a supply voltage V to the at least one power semiconductor chip 120.

The external terminals 130 of the semiconductor package 100 comprise a second external terminal 132 connected to the source contact region 122. The second external terminal is located centrally on the second lateral side 112 of the encapsulation 110, for example directly opposite the first external terminal 131. The second external terminal 132 can be equally spaced or approximately equally spaced from both ends of the second lateral side 112, for example. The second external terminal 132 is configured to apply a reference voltage R to the at least one power semiconductor chip 120.

The external terminals 130 of the semiconductor package 100 comprise a third external terminal 133 and a fourth external terminal 134. The third and fourth external terminals 133, 134 are each connected to the first inner contact region 123. The third and fourth external terminals 133, 134 are arranged opposite each other at a first end of the first and second lateral sides 111, 112, respectively. The third and fourth external terminals 133, 134 are configured as a first output OUT1 of the semiconductor package 100 (or an electrical circuit implemented in the semiconductor package 100).

The external terminals 130 of the semiconductor package 100 comprise a fifth external terminal 135 and a sixth external terminal 136. The fifth and sixth external terminals 135, 136 are connected to the second inner contact region 124. The fifth and sixth external terminals 135, 136 are arranged opposite each other at a second end of the first and second lateral sides 111, 112, respectively. The fifth and sixth external terminals 135, 136 are configured as a second output OUT2 of the semiconductor package 100 (or an electrical circuit implemented in the semiconductor package 100).

The external terminals 130 are exposed on the encapsulation 110. The external terminals 130 can protrude beyond an outline of the encapsulation 110, as shown in the example of FIG. 1. However, it is also possible that the external terminals 130 do not protrude beyond the outline of the encapsulation (in which case the semiconductor package 100 can be referred to as a leadless package).

The external terminals 130 can be connected to the various contact regions of the power semiconductor chip 120 via any suitable electrical connection, such as by bonding wires and/or by clips. The external terminals 131-136 can be power terminals of the semiconductor package 100. According to one example, each of these power terminals is connected to the relevant one of the contact regions 121-124 via a plurality of bonding wires to reduce the electrical resistance of this connection.

As shown in the example of FIG. 1, in addition to the power terminals 131-136, the external terminals 130 can also comprise control terminals 137 (in FIG. 1, only two of the control terminals 137 are provided with reference signs for clarity). The control terminals 137 can be arranged, for example, along the first lateral side 111 and/or the second lateral side 112. The control terminals 137 can be arranged, for example, between the power terminals 131-136. The control terminals 137 can be arranged symmetrically, as shown in FIG. 1 (for example, two control terminals 137 to the left of the first and/or second external terminals 131, 132 and two control terminals to the right of the first and/or second external terminals 131, 132). Alternatively, the control terminals 137 can also be arranged asymmetrically.

The control terminals 137 can be configured to apply control signals to the at least one power semiconductor chip 120. For example, eight control terminals 137 can be provided to which eight control signals C1-C8 can be applied.

The power semiconductor chip 120 can have first, second, third, and fourth transistors M1-M4 (the individual transistor regions are shown by dashed lines in FIG. 1). The first transistor M1 can be connected to the drain contact region 121 and the first inner contact region 123. The second transistor M2 can be connected to the source contact region 122 and the first inner contact region 123. The third transistor M3 can be connected to the drain contact region 121 and the second inner contact region 124. The fourth transistor M4 can be connected to the source contact region 122 and the second inner contact region 124. The four transistors M1-M4 can represent the switches of an H-bridge circuit. The first and third transistors M1, M3 can represent the "high side" switches and the second and fourth transistors M2, M4 can represent the "low side" switches of the H-bridge circuit.

As shown in the example of FIG. 1, the power semiconductor chip 120 can further have an integrated circuit IC. The integrated circuit can be configured to control the H-bridge circuit, or transistors M1-M4.

As shown in FIG. 1, the transistors M1-M4 can occupy regions of the power semiconductor chip 120 that are approximately the same size or exactly the same size. For example, the region for the integrated circuit IC can be comparatively narrow and can run, for example, along a longitudinal edge of the power semiconductor chip 120, for example along the longitudinal edge facing the first lateral side 111 of the encapsulation 110. The region for the integrated circuit IC can also be arranged, for example, in the center or approximately in the center of the power semiconductor chip 120, and the regions for the transistors M1-M4 can be arranged around the region of the integrated circuit IC. Further, the region for the integrated circuit IC need not necessarily have the elongate shape shown in FIG. 1, but instead can have, for example, a square shape, a diamond shape, etc., as is technically suitable for the particular application. The regions for the transistors M1-M4 can be arranged in a checkerboard pattern next to the region for the integrated circuit IC.

By arranging the external terminals 131-136 as well as the contact regions 121-124 relative to each other in the semiconductor package 100 in the manner described above, the length and/or number of bonding wires, clips or other electrical connections connecting the contact regions 121-124 to the various external terminals 131-136 can be minimized. This can include, for example, arranging the bonding points on each contact region 121-124 and the relevant one of the external terminals 131-136 in the semiconductor package 100 as close to each other as possible, to the extent that this is technically possible or practical, so that the electrical connections do not have to be stretched "diagonally" across the power semiconductor chip 120, for example in the plan view of FIG. 1. In this way, parasitic resistances or parasitic inductances attributable to these electrical connections can in turn be reduced, which can be a crucial criterion for achieving optimal performance of semiconductor packages such as the semiconductor package 100 (particularly important, for example, when used as drivers for e-motors).

Figure 2:
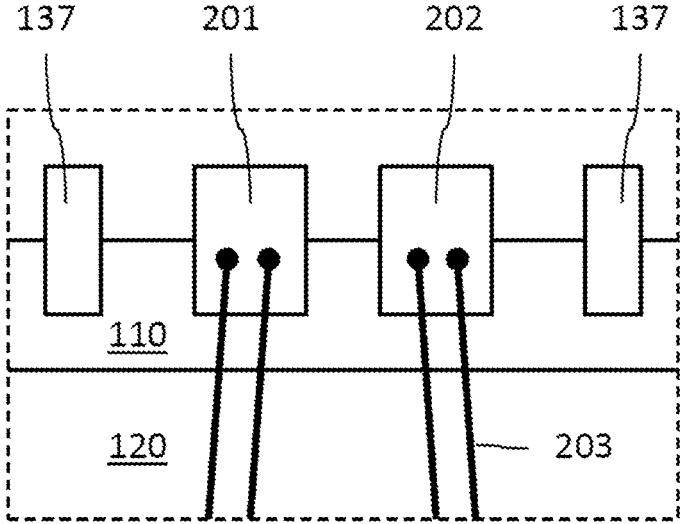
FIG. 2 shows a detailed view of two separate power terminals, both of which are connected to the same contact region of at least one power semiconductor chip.

FIG. 2 shows a detailed view of an alternative example of the semiconductor package 100, in which two external terminals 201 and 202 are provided instead of the first external terminal 131.

The external terminals 201 and 202 can be arranged directly adjacently to each other. The external terminals 201 and 202 are both connected to the drain contact region 121.

According to one example, two or more external terminals 201, 202 can also be used in place of any one of the second to sixth external terminals 132-136, respectively.

By using two external connectors 201, 202 instead of a single external connector, it can be easier, for example, to detect a defect in electrical connections 203 connecting the external connectors 201, 202 to the relevant contact region.

Figure 3:
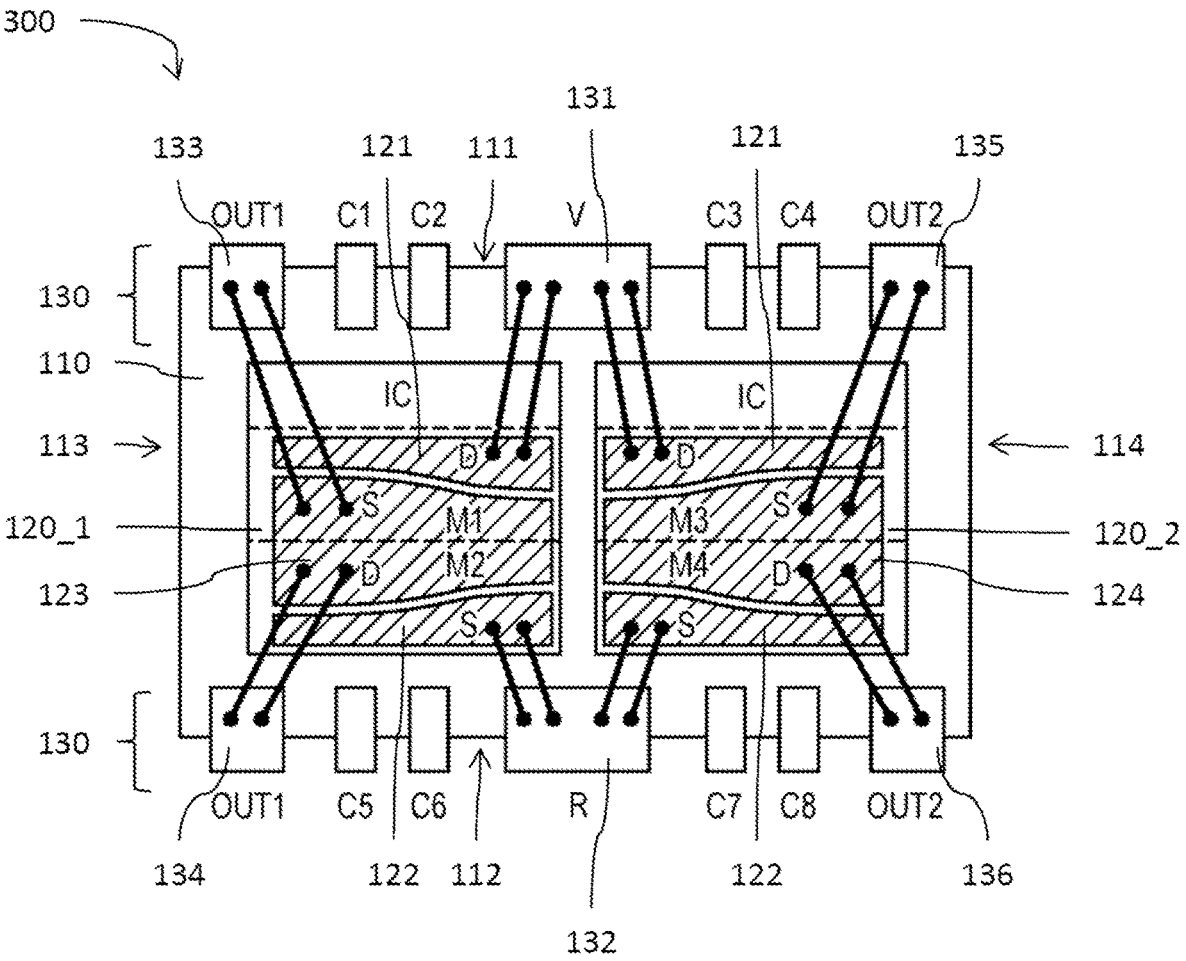
FIG. 3 shows another semiconductor package, which comprises two power semiconductor chips arranged laterally next to each other.

FIG. 3 shows another semiconductor package 300, which can be similar or identical to the semiconductor package 100 except for the differences described below.

In particular, the semiconductor package 300 comprises a first power semiconductor chip 120_1 and a second power semiconductor chip 120_2. The two power semiconductor chips 120_1, 120_2 can be arranged laterally adjacently to each other in the semiconductor package 300. For example, the two power semiconductor chips 120_1, 120_2 can be arranged on a common chip carrier or on two separate chip carriers. In the latter case, the two chip carriers can, for example, both be parts of the same leadframe.

Both power semiconductor chips 120_1, 120_2 have the drain contact region 121 and source contact region 122. However, only the first power semiconductor chip 120_1 comprises the first inner contact region 123 and only the second power semiconductor chip 120_2 comprises the second inner contact region 124.

Further, the first power semiconductor chip 120_1 can have the first transistor M1 and the second transistor M2, and the second power semiconductor chip 120_2 can have the third transistor M3 and the fourth transistor M4. The first transistor M1 can be connected to the drain contact region 121 and the first inner contact region 123. The second transistor M2 can be connected to the source contact region 122 and also to the first inner contact region 123. The third transistor M3 can be connected to the drain contact region 121 and the second inner contact region 124. The fourth transistor M4 can be connected to the source contact region 122 and also to the second inner contact region 124.

According to an example, the first power semiconductor chip 120_1 can further have a first integrated circuit IC and the second power semiconductor chip 120_2 can have a second integrated circuit IC. The integrated circuits IC can be configured to control the various transistors M1-M4 of the power semiconductor chips 120_1, 120_2.

As shown in FIG. 3, the first and second external terminals 131, 132 can be arranged in the semiconductor package 300, for example at inner edges of the power semiconductor chips 120_1, 120_2 (whereas in the semiconductor package 100, they can be arranged centrally of lateral sides of the power semiconductor chip 120). However, the first and second external terminals 131, 132 can also be arranged in the semiconductor package 300 centrally of lateral sides 111, 112 of the encapsulation 110, similarly to the semiconductor package 100 (cf. FIG. 3).

Figure 4:
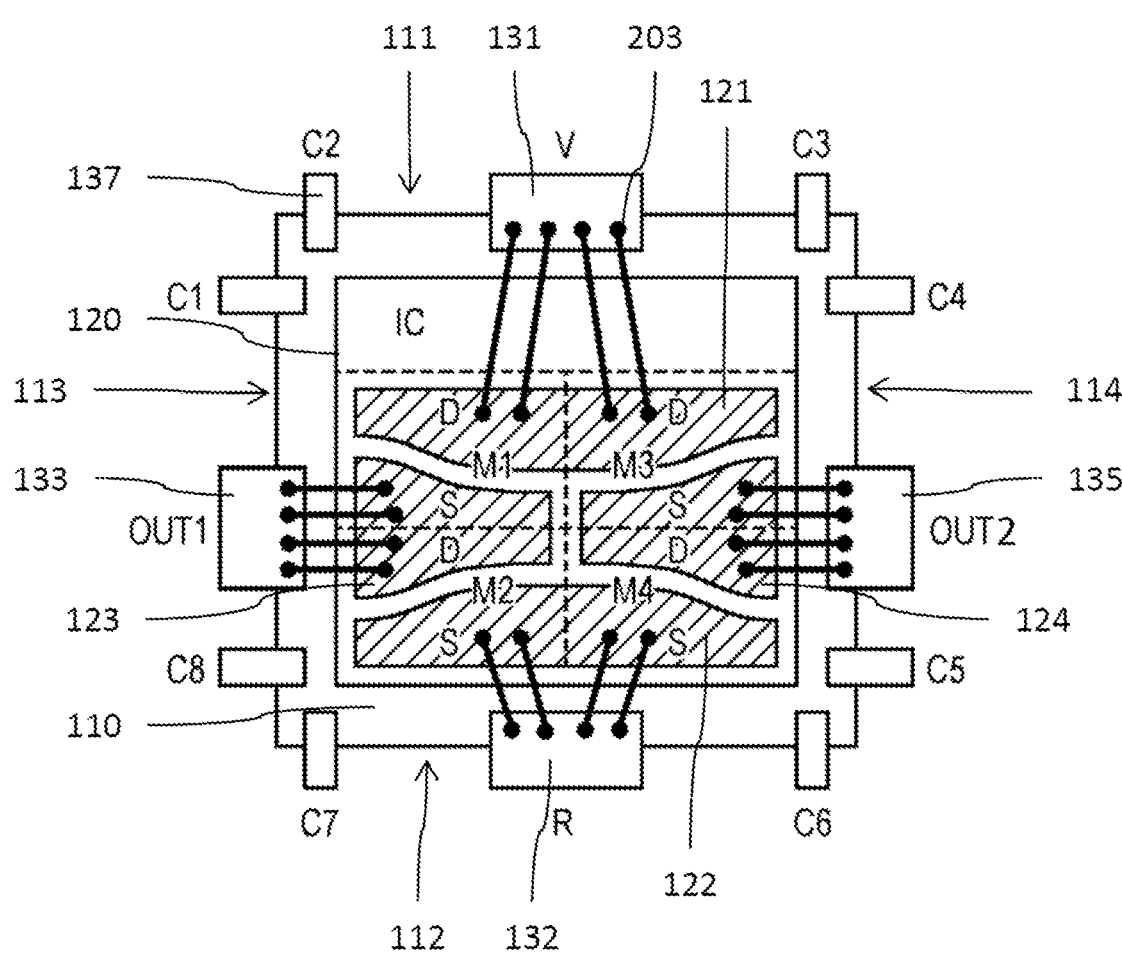
FIG. 4 shows another semiconductor package with a power semiconductor chip, wherein the semiconductor package has a square outline.

FIG. 4 shows another semiconductor package 400, which can be similar or identical to the semiconductor package 100 except for the differences described below.

In particular, the semiconductor package 400 has a square or nearly square outline, i.e., all four lateral sides 111-114 are the same length or nearly the same length. Further, the power semiconductor chip 120 can have a square or nearly square outline.

In the semiconductor package 400, the external terminals 131-135 are arranged not only along two of the lateral sides 111-114 of the encapsulation 110, but along all four of the lateral sides 111-114. In particular, the first external terminal 131 can be arranged centrally of the first lateral side 111, the second external terminal 132 can be arranged centrally of the second lateral side 112, the third external terminal 133 can be arranged centrally of the third lateral side 113, and the fifth external terminal 135 can be arranged centrally of the fourth lateral side 114. For example, control terminals 137 can be arranged at the corners of the encapsulation 110, but power terminals cannot.

Similarly to the rectangular semiconductor packages 100 and 300, the square semiconductor package 400 can also be configured to minimize the length of the electrical connections 203 connecting the contact regions 121-124 to the external terminals 131-135 and to minimize the associated parasitic resistances or inductances.

Figure 5:
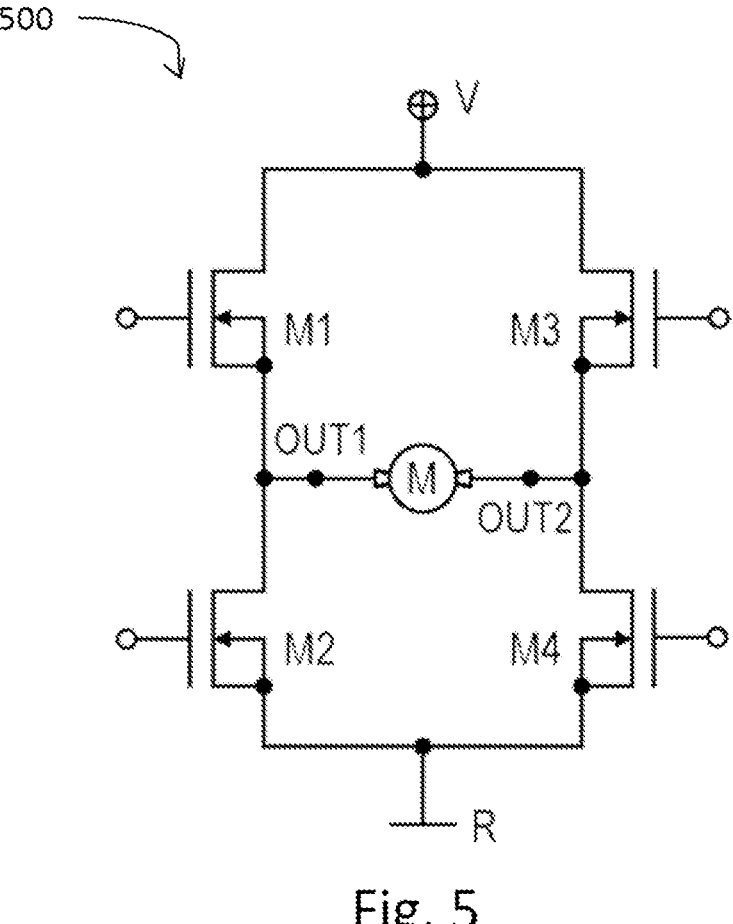
FIG. 5 is a circuit diagram of an H-bridge circuit that can be implemented in a semiconductor package.

FIG. 5 shows an H-bridge circuit 500, which can be implemented in the semiconductor packages 100-400. The transistors M1-M4 can represent the switches, the external terminals 131 and 132 can represent the inputs for supply voltage V and reference voltage R, and the external terminals 133-136 can represent the outputs OUT1 and OUT2 of the H-bridge circuit 500.

For example, the H-bridge circuit 500 can be configured to connect an electric motor M to the outputs OUT1 and OUT2 to serve as a driver circuit for the electric motor M.

FIG. 6 is a flowchart of a method 600 for producing a semiconductor package. The method 600 can be used, for example, to produce the semiconductor packages 100 and 300. A similar method can be used to produce the semiconductor package 400.

The method 600 comprises, at 601, providing a power semiconductor chip having a first lateral side and an opposite second lateral side, wherein the power semiconductor chip comprises a drain contact region running along the first lateral side, a source contact region running along the second lateral side, and first and second inner contact regions arranged between the drain and source contact regions, at 602, connecting the drain contact region to a first external terminal which is arranged on the first lateral side and is configured to apply a supply voltage to the power semiconductor chip, at 603, connecting the source contact region to a second external terminal which is arranged on the second lateral side and is configured to apply a reference voltage for the power semiconductor chip, at 604, connecting the first inner contact region to third and fourth external terminals which are arranged opposite each other on the first and second lateral sides, respectively, and are configured as a first output of the semiconductor package, at 605, connecting the second inner contact region to fifth and sixth external terminals oppositely arranged on the first and second lateral sides, respectively, and configured as a second output of the semiconductor package, and, at 606, encapsulating the power semiconductor chip in an encapsulation such that the external terminals are exposed at the encapsulation.

EXAMPLES

In the following, the semiconductor package and the method for producing a semiconductor package are further explained with reference to specific examples.

Example 1 is a semiconductor package comprising: an encapsulation having a first lateral side and an opposite second lateral side, at least one power semiconductor chip having a drain contact region running along the first lateral side, a source contact region running along the second lateral side, and first and second inner contact regions arranged between the drain and source contact regions, a first external terminal which is connected to the drain contact region, is arranged centrally on the first lateral side, and is configured to apply a supply voltage for the at least one power semiconductor chip, a second external terminal which is connected to the source contact region, is arranged centrally on the second lateral side, and is configured to apply a reference voltage for the at least one power semiconductor chip, third and fourth external terminals which are connected to the first inner contact region, are arranged opposite each other at a first end of the first and second lateral sides, respectively, and are configured as a first output of the semiconductor package, and fifth and sixth external terminals which are connected to the second inner contact region, are arranged opposite each other at a second end of the first and second lateral sides, respectively, and are configured as a second output of the semiconductor package.

Example 2 is the semiconductor package according to Example 1, wherein the semiconductor package comprises a single power semiconductor chip, wherein the power semiconductor chip comprises first, second, third, and fourth transistors, wherein the first transistor is connected to the drain contact region and the first inner contact region, wherein the second transistor is connected to the source contact region and the first inner contact region, wherein the third transistor is connected to the drain contact region and the second inner contact region, and wherein the fourth transistor is connected to the source contact region and the second inner contact region.

Example 3 is the semiconductor package according to Example 2, wherein the power semiconductor chip further comprises an integrated circuit for controlling the first, second, third, and fourth transistors.

Example 4 is the semiconductor package according to Example 1, wherein the semiconductor package comprises first and second power semiconductor chips, wherein both power semiconductor chips comprise the drain contact region and the source contact region, and wherein only the first power semiconductor chip comprises the first inner contact region and only the second power semiconductor chip comprises the second inner contact region.

Example 5 is the semiconductor package according to Example 4, wherein the first power semiconductor chip comprises first and second transistors, and the second power semiconductor chip comprises third and fourth transistors, wherein the first transistor is connected to the drain contact region and the first inner contact region, wherein the second transistor is connected to the source contact region and the first inner contact region, wherein the third transistor is connected to the drain contact region and the second inner contact region, and wherein the fourth transistor is connected to the source contact region and the second inner contact region.

Example 6 is the semiconductor package according to Example 4 or 5, wherein the first power semiconductor chip further comprises a first integrated circuit and the second power semiconductor chip further comprises a second integrated circuit.

Example 7 is the semiconductor package according to one of the preceding examples, wherein the various contact regions and external terminals are connected to each other by bonding wires or by clips.

Example 8 is the semiconductor package according to one of the preceding examples, further comprising: at least one chip carrier, wherein the at least one power semiconductor chip is arranged on the at least one chip carrier, and wherein the at least one chip carrier and the external terminals are parts of one or more leadframes.

Example 9 is the semiconductor package according to one of the preceding examples, further comprising: a plurality of external control terminals arranged along the first lateral side and along the second lateral side and configured to apply control signals for the at least one power semiconductor chip.

Example 10 is the semiconductor package according to one of the preceding examples, wherein the encapsulation further comprises third and fourth lateral sides, wherein the drain and source contact regions taper toward the third and fourth lateral sides, and wherein the first and second inner contact regions widen toward the third and fourth lateral sides.

Example 11 is the semiconductor package according to one of the preceding examples, wherein all of the contact regions are arranged on an upper main side of the at least one power semiconductor chip.

Example 12 is the semiconductor package according to one of the preceding examples, wherein the encapsulation comprises a molded body.

Example 13 is a semiconductor package comprising: an encapsulation having a first lateral side, a second lateral side opposite the first lateral side, a third lateral side, and a fourth lateral side opposite the third lateral side, a power semiconductor chip having a drain contact region running along the first lateral side, a source contact region running along the second lateral side, and first and second inner contact regions arranged between the drain and source contact regions, a first external terminal which is connected to the drain contact region, is arranged centrally on the first lateral side, and is configured to apply a supply voltage for the power semiconductor chip, a second external terminal which is connected to the source contact region, is arranged centrally on the second lateral side, and is configured to apply a reference voltage for the power semiconductor chip, a third external terminal which is connected to the first inner contact region, is arranged centrally on the third lateral side, and is configured as a first output of the semiconductor package, and a fifth external terminal which is connected to the second inner contact region, is arranged centrally on the fourth lateral side, and is configured as a second output of the semiconductor package.

Example 14 is the semiconductor package according to Example 13, wherein the encapsulation has a square outline.

Example 15 is the semiconductor package according to Example 13 or 14, wherein the power semiconductor chip comprises first, second, third, and fourth transistors, wherein the transistors are connected together in an H-bridge circuit, and wherein the first and second outputs are the outputs of the H-bridge circuit.

Example 16 is a method for producing a semiconductor package, wherein the method comprises: providing a power semiconductor chip having a first lateral side and an opposite second lateral side, wherein the power semiconductor chip comprises a drain contact region running along the first lateral side, a source contact region running along the second lateral side, and first and second inner contact regions arranged between the drain and source contact regions, connecting the drain contact region to a first external terminal which is arranged on the first lateral side and is configured to apply a supply voltage for the power semiconductor chip, connecting the source contact region to a second external terminal which is arranged on the second lateral side and is configured to apply a reference voltage for the power semiconductor chip, connecting the first inner contact region to third and fourth external terminals which are arranged opposite each other on the first and second lateral sides, respectively, and are configured as a first output of the semiconductor package, connecting the second inner contact region to fifth and sixth external terminals which are arranged opposite each other on the first and second lateral sides, respectively, and are configured as a second output of the semiconductor package, and encapsulating the power semiconductor chip in an encapsulation such that the external terminals are exposed at the encapsulation.

Example 17 is the method according to Example 16, wherein connecting each contact region to the relevant external terminal comprises wire bonding or attaching a clip.

Example 18 is the method according to Example 16 or 17, wherein providing the power semiconductor chip comprises arranging the power semiconductor chip on a chip carrier such that all of the contact regions face away from the chip carrier.

Although specific examples have been presented and described herein, it is apparent to a person of average skill in the art that a variety of alternative and/or equivalent implementations can be substituted for the specific examples shown and described without departing from the scope of the present disclosure. This application is intended to cover any adaptations or variations of the specific examples discussed herein. Therefore, it is intended that this disclosure be limited only by the claims and equivalents thereof.

The invention claimed is:

1. A semiconductor package comprising:
an encapsulation including a first lateral side and an opposite second lateral side,
at least one power semiconductor chip including a drain contact region running along the first lateral side, a source contact region running along the second lateral side, and first and second inner contact regions arranged between the drain and source contact regions,
a first external terminal which is connected to the drain contact region, is arranged centrally on the first lateral side, and is configured to apply a supply voltage for the at least one power semiconductor chip,
a second external terminal which is connected to the source contact region, is arranged centrally on the second lateral side, and is configured to apply a reference voltage for the at least one power semiconductor chip,
third and fourth external terminals which are connected to the first inner contact region, are arranged opposite each other at a first end of the first and second lateral sides, respectively, and are configured as a first output of the semiconductor package, and
fifth and sixth external terminals which are connected to the second inner contact region, are arranged opposite each other at a second end of the first and second lateral sides, respectively, and are configured as a second output of the semiconductor package.

2. The semiconductor package according to claim 1, wherein the semiconductor package comprises a single power semiconductor chip,
wherein the power semiconductor chip comprises first, second, third, and fourth transistors,
wherein the first transistor is connected to the drain contact region and the first inner contact region,
wherein the second transistor is connected to the source contact region and the first inner contact region,
wherein the third transistor is connected to the drain contact region and the second inner contact region, and
wherein the fourth transistor is connected to the source contact region and the second inner contact region.

3. The semiconductor package according to claim 2, wherein the power semiconductor chip further comprises an integrated circuit for controlling the first, second, third, and fourth transistors.

4. The semiconductor package according to claim 1, wherein the semiconductor package comprises first and second power semiconductor chips, wherein both the first and second power semiconductor chips comprise the drain contact region and the source contact region, and
wherein only the first power semiconductor chip comprises the first inner contact region and only the second power semiconductor chip comprises the second inner contact region.

5. The semiconductor package according to claim 4, wherein the first power semiconductor chip comprises first and second transistors and the second power semiconductor chip comprises third and fourth transistors,
wherein the first transistor is connected to the drain contact region and the first inner contact region,
wherein the second transistor is connected to the source contact region and the first inner contact region,
wherein the third transistor is connected to the drain contact region and the second inner contact region, and
wherein the fourth transistor is connected to the source contact region and the second inner contact region.

6. The semiconductor package according to claim 4, wherein the first power semiconductor chip further comprises a first integrated circuit and the second power semiconductor chip further comprises a second integrated circuit.

7. The semiconductor package according to claim 1, wherein various contact regions and external terminals are connected by bonding wires or by clips.

8. The semiconductor Semiconductor package according to claim 1, further comprising:
at least one chip carrier, wherein the at least one power semiconductor chip is arranged on the at least one chip carrier, and
wherein the at least one chip carrier and the external terminals are parts of one or more leadframes.

9. The semiconductor package according to claim 1, further comprising:
a plurality of external control terminals which are arranged along the first lateral side and along the second lateral side and are configured to apply control signals for the at least one power semiconductor chip.

10. The semiconductor package according to claim 1, wherein the encapsulation further comprises third and fourth lateral sides,
wherein the drain and source contact regions taper toward the third and fourth lateral sides, and
wherein the first and second inner contact regions widen toward the third and fourth lateral sides.

11. The semiconductor package according to claim 1, wherein all of the contact regions are arranged on an upper main side of the at least one power semiconductor chip.

12. The semiconductor package according to claim 1, wherein the encapsulation comprises a molded body.

13. A method for producing a semiconductor package, wherein the method comprises:
providing a power semiconductor chip having a first lateral side and an opposite second lateral side, wherein the power semiconductor chip comprises a drain contact region running along the first lateral side, a source contact region running along the second lateral side, and first and second inner contact regions arranged between the drain and source contact regions,
connecting the drain contact region to a first external terminal which is arranged on the first lateral side and is configured to apply a supply voltage for the power semiconductor chip,
connecting the source contact region to a second external terminal which is arranged on the second lateral side and is configured to apply a reference voltage for the power semiconductor chip, connecting the first inner contact region to third and fourth external terminals which are arranged opposite each other on the first and second lateral sides, respectively, and are configured as a first output of the semiconductor package, connecting the second inner contact region to fifth and sixth external terminals which are arranged opposite each other on the first and second lateral sides, respectively, and are configured as a second output of the semiconductor package, and encapsulating the power semiconductor chip in an encapsulation such that the external connections to the encapsulation are exposed.

14. The method according to claim 13, wherein connecting the drain contact region, connecting the source contact region, connecting the first inner contact region, and connecting the second inner contact region each comprises wire bonding or attaching a clip.

15. The method according to claim 13, wherein providing the power semiconductor chip comprises arranging the power semiconductor chip on a chip carrier such that all of the contact regions face away from the chip carrier.

\* \* \* \* \*